(12) United States Patent
Zimmerman et al.

(10) Patent No.: US 6,798,193 B2
(45) Date of Patent: Sep. 28, 2004

(54) CALIBRATED, LOW-PROFILE MAGNETIC SENSOR

(75) Inventors: Mike W. Zimmerman, Freeport, IL (US); Lamar F. Ricks, Freeport, IL (US); Curtis B. Johnson, Freeport, IL (US); Joel D. Stolfus, Freeport, IL (US); Douglas L. Mueller, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/219,239

(22) Filed: Aug. 14, 2002

(65) Prior Publication Data

US 2004/0032251 A1 Feb. 19, 2004

(51) Int. Cl.⁷ .............................. G01R 35/00; G01R 7/30
(52) U.S. Cl. ....................... 324/202; 324/207.25; 29/595
(58) Field of Search .......................... 324/207.25, 202, 324/207.2, 207.21, 235; 174/52.2; 29/595

(56) References Cited

U.S. PATENT DOCUMENTS 5,606,255 A * 2/1997 Shimbo et al. .......... 324/207.2
5,729,128 A * 3/1998 Bunyer et al. ............... 324/202
5,912,556 A   6/1999 Frazee et al.

\* cited by examiner

*Primary Examiner*—Jay Patidar
(74) *Attorney, Agent, or Firm*—Kris T. Fredrick; Kermit D. Lopez; Luis M. Ortiz

(57) ABSTRACT

A calibrated, low-profile magnetic sensor and method for forming such a sensor are described herein. Generally, a magnetic sensing device is formed within a housing, wherein the magnetic sensing device comprises at least one magnet. The magnetic sensor includes a compact integrated circuit package such as, for example, a small outline integrated circuit package (SOIC). A magnetic sensing element is generally mounted to the compact integrated circuit package. The magnetic sensing device can be configured to additionally incorporate a printed circuit board (PCB) having a hole formed therein such that the compact integrated circuit package can be surface mounted off-center on the printed circuit board, so that the hole can be located within the printed circuit board to match a shape of the magnet, allowing the magnet to pass through the circuit board adjacent to the SOIC to complete the magnetic circuit. An orifice placed with in the housing permits a tool to be passed through the orifice within the housing to contact the magnet. The magnet can be placed in the optimum position for calibration of the magnetic circuit thereof. The same orifice that is used for calibrating the position of the magnet can also be utilized as an injection port for encapsulating the device using an injection epoxy dispensing process.

30 Claims, 3 Drawing Sheets

CALIBRATED, LOW-PROFILE MAGNETIC SENSOR

TECHNICAL FIELD

The present invention generally relates to sensing devices and sensing techniques thereof. The present invention also relates to magnetic sensors. The present invention additionally relates to printed circuit board (PCB) and small outline integrated circuit (SOIC) devices and components utilized in magnetic sensor packages. The present invention also relates to techniques for calibrating magnetic sensors.

BACKGROUND OF THE INVENTION

A variety of magnetic sensors are known in the art. Such magnetic sensors are utilized in automotive applications, including, but not limited to, camshaft, crankshaft and rotary position sensors. Such sensors often are configured to include Hall effect or magnetoresistive (MR) transducers, which are typically combined within magnetic or ferromagnetic targets having a pattern of features keyed to mechanical details being monitored by the magnetic sensor. These features represent the magnetic signature of a magnetized target or the presence or absence of ferromagnetic metal in various sizes on a metal target placed near an associated transducer.

Semiconductor Hall elements and magnetoresistors, in particular, are widely used in magnetic sensing applications. Such "Hall" elements are based on the Hall effect, well known in the art, which arises from the Lorentz force acting on the charge carriers in a conductive material. This phenomenon arises as follows: given a rectangular thin plate of conductive material with an electric potential applied along the Y axis and a magnetic field applied perpendicular to the plate (along the Z axis), the Lorentz force is represented by the formulation $F=q(v \times B)$, such that the variable q represents the charge of the carrier (usually electrons), the variable v represents the velocity of the charge carrier, and the variable B represents the magnetic field. The force distorts the current flow and crowds it toward one side of the conductive plate. This phenomenon distorts the equipotential lines and generates a Hall voltage.

The Hall voltage is proportional to $\mu B$, wherein the variable $\mu$ represents the mobility of the material, and the variable B represents the magnitude of the magnetic field. Pickoff points for the Hall signal ($V_{o1}-V_{o2}$) are usually located at the midpoint of the plate along the Y axis. In long plates, a Hall electric field balances the Lorentz force, and the current flow becomes parallel to the Y axis, driving the Hall voltage to zero. Most practical Hall elements are roughly square and the current flow is at an angle with respect to the excitation voltage. This is what gives rise to the geometric magnetoresistance effect, which is further described below.

The fact that the current must travel further in a short Hall plate when a magnetic field is applied causes an increase in resistance. This phenomenon is referred to as the geometric magnetoresistance effect. Magnetoresistor (MR) elements typically have their length less than or equal to their width. A long resistor would thus not exhibit a magnetoresistance effect. Practical sensors generally utilize a large number of elements in series to increase the insertion resistance. The geometric magnetoresistance effect is proportional to $\mu^2 B^2$ for small fields (i.e., where $\mu$ represents the mobility) and thus requires a significant magnetic bias to obtain a useful signal. The change in resistance is identical for a positive or negative field of the same magnitude.

Magnetic sensors are generally utilized to sense the position or location of a particular target. When a metal target is circular in shape, for example, the sensing mechanism may be referred to as a "gear tooth sensor" because of the resemblance of the target to a toothed mechanical gear. These gear tooth sensors are often used in the automotive arts in situations in which the target is linked to a crankshaft for use in engine control.

As a result of government regulations and the desire by automobile manufactures for the ability to provide misfire detection in automobile engines, the required accuracy and repeatability of automotive gear tooth sensors have been steadily increasing in recent years. In combination with these increasing requirements, operating conditions of gear tooth sensors now include increased air gap dimensions and axial run-out conditions. Additionally, larger effective magnetic signals are required to improve the signal-to-noise ratio of the device.

The magnitude of the effective magnetic signals in a gear tooth sensor can be increased by increasing the size and strength of the permanent magnet or, alternatively, by decreasing the distance between the permanent magnet and the target. If the size and strength of the magnet are increased, the overall costs of the gear tooth sensor will also be increased. A less expensive method for producing larger magnetic signals involves the design of a package for the gear tooth sensor that can minimize the distance between the permanent magnet and the ferromagnetic target. Such a reduction in the distance between the magnet and the target can also permit smaller permanent magnets to be utilized at a reduced cost.

With regard to the characteristic that permits the magnet to be placed closer to the target, it should be understood that in the past gear tooth sensors have been constructed with small outline integrated circuit (SOIC) component packages. These structures are typically disposed on an electrical substrate, such as a flex circuit or printed circuit board (PCB). The permanent magnet is disposed beneath the SOIC component and is usually separated from it by some type of plastic thickness.

In a typical prior art gear tooth sensor package of this type, the resulting distance between the pole face of the permanent magnet and the target comprises the plastic thickness on which the electrical substrate is mounted. Such a resulting distance also can determine the thickness of the electrical substrate (e.g., printed circuit board, flex circuit) and the SOIC thickness, which includes the stand-off height of the leads, the bottom plastic thickness of the SOIC, the lead frame thickness, the die thickness, the wire bond maximum height, the clearance above the wire bond maximum height, and the top plastic thickness of the SOIC.

Based on the foregoing, it can be appreciated that sensor designers continually seek refinement of the target system to improve engine control. Many sensing applications require a small diameter probe sensor with a short mounting profile from an associated mounting flange to a spinning ferrous target. Some application specifications require a calibrated magnetic circuit to ensure proper performance at all times and under all possible conditions. Devices based on such applications may also require sealing for an automotive under-the-hood environment and to provide an O-ring type seal to the engine. Having an O-ring configuration incorporated into the sensor reduces the working diameter of the internal sensor construction.

The present inventors have determined that a process issue associated with such prior art designs that must be overcome involves the use of integrated-circuit (IC) packages that may be mounted 90 degrees to the plane of the printed circuit board. Such a configuration requires a much more difficult through-hole soldering process that results in a greater amount of reworking, which in turn affects cost and efficiency. The present inventors have thus concluded that a solution to these issues involves the creation of a new design that utilizes an SOIC package that eliminates the need for a secondary through-hole soldering process to attach the IC. According to the present invention, an SOIC solder attachment results in a more robust process and eliminates the solder rework created by the through-hole solder process.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide an improved magnetic sensor.

It is another aspect of the present invention to provide a calibrated, low-profile magnetic sensor.

It is still another aspect of the present invention to provide a magnetic sensor assembly package that eliminates the need for secondary through-hole soldering to attach a compact integrated circuit package.

It is yet another aspect of the present invention to provide a method for forming a calibrated low-profile magnetic sensor.

The above and other aspects can be achieved as is now described. A calibrated, low-profile magnetic sensor and method for forming such a sensor are described herein. Generally, a magnetic sensing device is formed within a housing, wherein the magnetic sensing device comprises at least one magnet. The magnetic sensor includes a compact integrated circuit package such as, for example, a small outline integrated circuit package (SOIC). A magnetic sensing element is generally mounted in the compact integrated circuit package. The magnetic sensing device can be configured to additionally incorporate a printed circuit board (PCB) having a hole formed therein, such that the compact integrated circuit package can be surface mounted off-center on the PCB, so that the hole is generally located within the printed circuit board to match a shape of the magnet, thereby allowing the magnet to pass through the hole so as to be placed adjacent to the compact circuit package, completing the magnetic circuit. An orifice can be built into the housing of the magnetic sensor with the axis of the orifice located coincidentally with the magnet. A tool can be passed through the orifice within the housing to contact the magnet. The tool is generally used to push the magnet into proper position for calibration optimization of the magnetic circuit thereof.

Thus, a magnetic sensing element can be mounted in an SOIC package, which in turn is surface mountable to a PCB. The SOIC is mounted off center on the PCB so that a hole can be placed within the PCB that fits the shape of the magnet. Such a magnet can be configured as a small outline magnet, which passes through the hole in the PCB adjacent to the SOIC to complete a magnetic circuit. The magnet is mounted such that the position of the magnet can be adjusted to provide the optimum magnetic circuit. An orifice can be placed within the magnetic sensor to gain access to the magnet to push it into proper calibration position. This same orifice also provides a port for the purpose of injection dispensing of epoxy used to encapsulate and seal the device. By the nature of using the same orifice for encapsulation and calibration of the magnet, the need for a secondary potting process to seal the calibration port is eliminated.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

Figure 1:
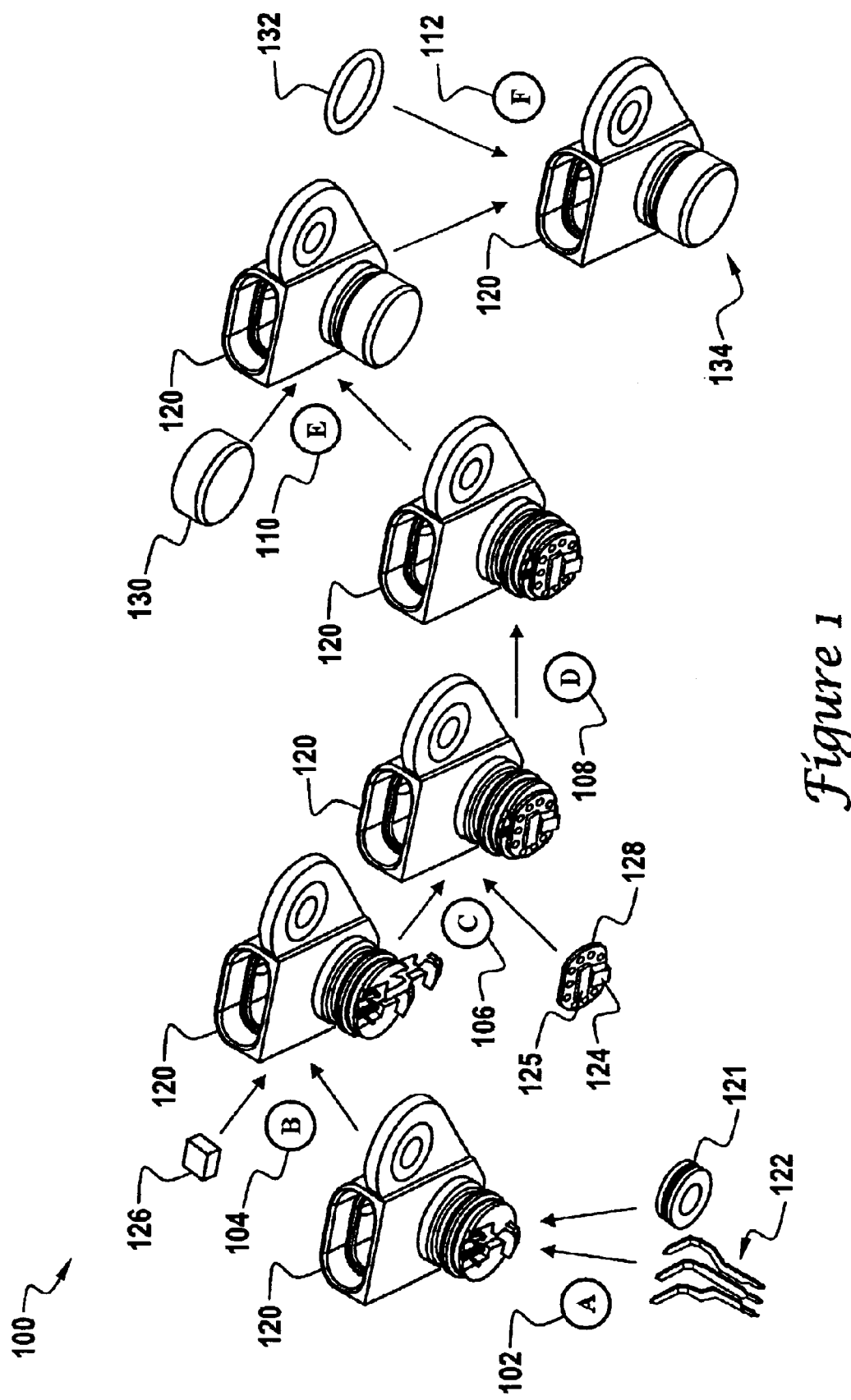
FIG. 1 depicts a pictorial diagram illustrating steps for assembling a magnetic sensor in accordance with the present invention.

FIG. 1 depicts a pictorial diagram 100 illustrating steps for assembling a magnetic sensor 134 in accordance with the present invention. Magnetic sensor 134 can be configured to include a housing 120. As illustrated at step 102 (i.e., step A), housing 120 can be adapted to incorporate a plurality of lead terminals 122 and a mounting bushing 121. Thereafter, as depicted at step 104 (i.e., step B), a magnet 126 can be installed and assembled within housing 120. Next, as indicated at step 106 (i.e., step C), a printed circuit board 128 can be installed and soldered or otherwise connected to housing 120. Note that printed circuit board 128 includes a hole 125 that is shaped to receive magnet 126. Additionally, a package 124 (e.g., a compact integrated circuit package) can be mounted off-center to printed circuit board 128. Package 124 can be, for example, an SOIC package.

As indicated next at step 108 (i.e., step D), the magnet can be moved for calibration. Thereafter, as illustrated at step 110 (i.e., step E), a plastic cover 130 can be assembled and connected to housing 120. The resulting device can thereafter be injection filled with an epoxy and cured. As indicated next at step 112 (i.e., step F), a seal 132 (e.g., O-ring seal) can be installed onto housing 120 to complete the formation of magnetic sensor 134. Magnetic sensor 134 thus comprises a calibrated, low-profile magnetic sensor.

Figure 2:
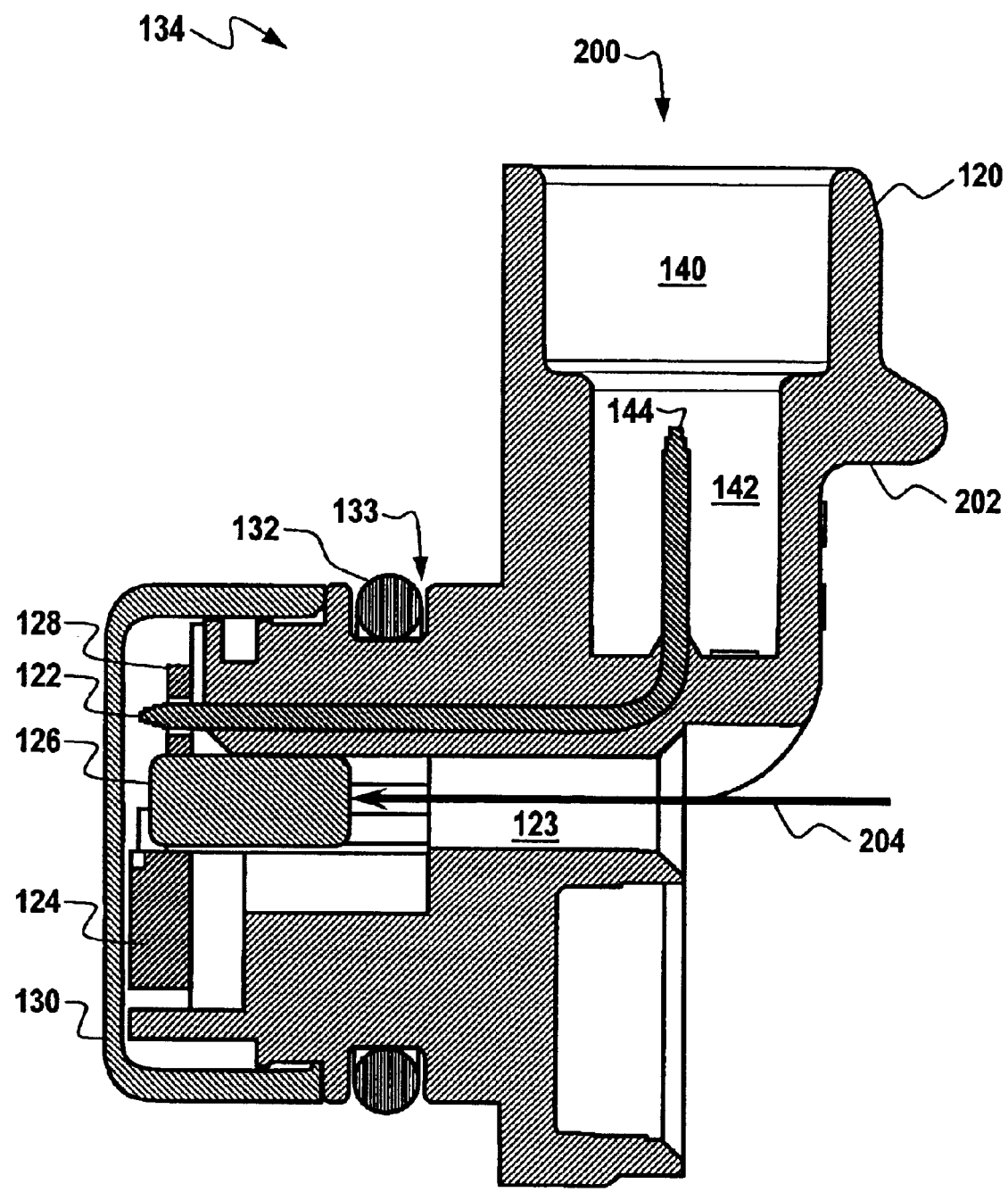
FIG. 2 depicts a side sectional view of a magnetic sensor in accordance with the present invention.

FIG. 2 illustrates a side sectional view 200 of magnetic sensor 134, in accordance with the present invention. Note that in FIGS. 1 and 2, identical or analogous parts are indicated by identical reference numerals. Thus, housing 120 is configured, as indicated in FIG. 2, to include a groove 133, which can receive a seal 132. Housing 120 also includes a first gap 140, which sits above a second gap 142. Additionally a plurality of lead terminals 122 is located within housing 120 such that a portion 144 of lead terminals 122 can protrude into second gap 142. Housing 120 can also be configured to include an insert portion (not illustrated) that can protrude from a side of housing 120.

Magnetic sensor 134 additionally includes magnet 126 and package 124 (e.g., SOIC), which in turn is mounted to printed circuit board 128. A printed circuit board 128 can be configured as a flat board fabricated of nonconducting material such as, for example, plastic or fiberglass, on which chips and other electronic components can be mounted. Predefined conductive metal pathways that are printed on the surface of the board can connect these component holes electrically. Metal leads protruding from the electronic components can be soldered to the conductive metal pathways to form a connection thereof. Printed circuit board 128 can thus be configured for protection against contamination and damage and from materials and phenomena such as dirt and static electricity Package 124 is generally mounted off center on printed circuit board 128 so that the hole 125 (shown in FIG. 1) can be placed within printed circuit board 128 that corresponds to the shape of magnet 126. Note that magnet 126 can be configured as a small outline magnet, which passes through the hole 125 in printed circuit board 128 adjacent to package 124 to complete a magnetic circuit. By utilizing a surface mounted SOIC (i.e., package 124) and allowing magnet 126 to pass through printed circuit board 128, the length of magnetic sensor 134 can be minimized. Also, by placing magnet 126 near the center of the shortened package 134, the diameter required for placement of groove 133 can be minimized and, hence, the overall package diameter can also be minimized.

The position of magnet 126 can be adjusted to provide an optimum magnetic circuit. Because adjustment is required utilizing a target placed in front of printed circuit board 128 and magnet 126, access for tooling to move magnet 126 to the proper position is permitted by placing magnet 126 coincident with the axis of orifice 123. A tool (i.e., calibration tool) can be passed through orifice 123 to contact magnet 126 for calibration, as indicated by arrow 204. Once the calibration is complete, the "calibration access/epoxy fill" orifice 123 can be sealed by a conventional injection epoxy dispensing process.

Thus, an epoxy injection process can use orifice 123. Such an orifice 123 may be referred to as an "epoxy injection orifice." In general, orifice 123 can comprise an access hole for the purpose of calibration of the position of magnet 126 and a port for dispensing of epoxy. Plastic cover 130 surrounds and protects said printed circuit board 128, said at least one magnet 126 and said compact integrated circuit package. Additionally, a plurality of ribs (not illustrated in FIG. 2) can be utilized to provide a press fit for maintaining magnet 126 in a calibrated position within magnetic sensor 134. Magnet 126 can be configured as a small outline magnet. Magnetic sensor 134 can be utilized, for example, as a camshaft sensor utilized in automobile and other transportation applications (e.g., aerospace, trucking, heavy equipment, etc).

Figure 3:
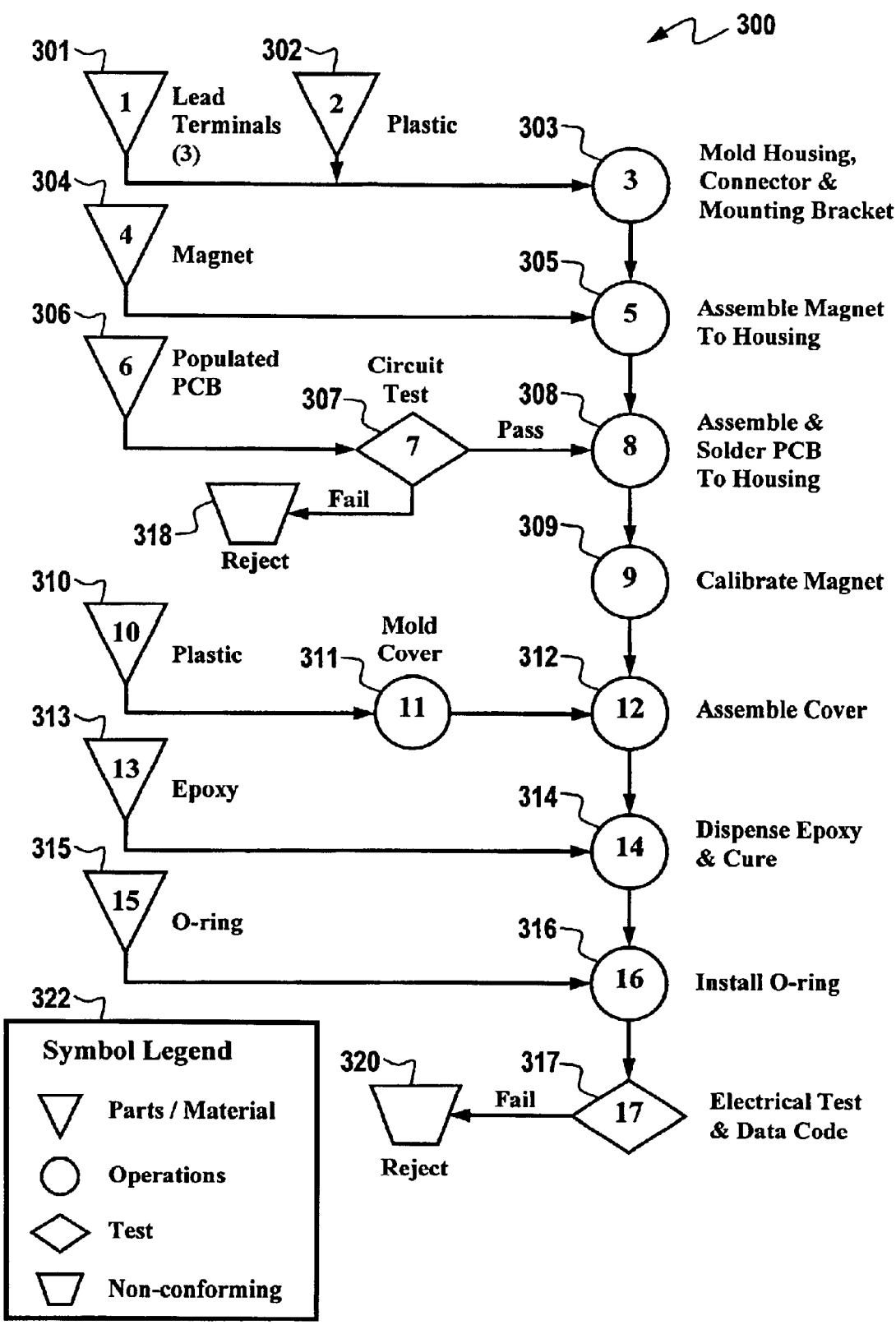
FIG. 3 depicts a flow chart of operations that can be implemented in forming a magnetic sensor in accordance with the present invention.

FIG. 3 depicts a flow chart 300 of operations illustrating operational steps that can be followed for forming a magnetic sensor in accordance with the present invention. Note that FIG. 3 also illustrates a legend box 322, which indicates appropriate shape representations associated with each step for forming and manufacturing the magnetic sensor. Thus, as illustrated respectively at blocks 301 and 302, a plurality of lead terminals (e.g., three terminals) can be confined within plastic and combined with a housing, connector and appropriate mounting bushing, as indicated at block 303.

Next, as indicated respectively at blocks 304 and 305, a magnet can be mounted to the housing. Thereafter, as illustrated at blocks 306 and 308 a printed circuit board can also be combined with the housing. Prior to joining the housing, however, a test is performed as illustrated at block 307 to determine whether the printed circuit board is functioning properly. If the printed circuit board fails, as indicated at block 318, that particular printed circuit board can then be discarded. Assuming that the printed circuit board passes the test, then as depicted at block 308, the printed circuit board can be soldered to the housing.

The magnet position can then be calibrated, as illustrated at block 309. Thereafter, as illustrated respectively at blocks 310, 311 and 312, a plastic mold cover can be assembled to the housing. Then, as indicated at blocks 313 and 314, an epoxy injection dispensing operation can be performed. The epoxy is thereafter dispensed and cured, as illustrated at block 314. As indicated next at blocks 315 and 316, a seal (e.g., O-ring seal) is installed on the housing. Finally, as illustrated at block 317, an electrical test and date coding operation can be performed to determine whether or not the magnetic sensor assembly formed thereof is functioning properly. If the magnetic sensor fails the test, then as illustrated at block 320, the magnetic sensor is rejected. Assuming that the magnetic sensor passes the electrical test, the magnetic sensor is thus ready for use with a desired sensor application.

Based on the foregoing, it can be appreciated that the present invention generally discloses and describes a calibrated, low-profile magnetic sensor and method for forming such a sensor. Generally, a magnetic sensing device is formed within a housing, wherein the magnetic sensing device comprises at least one magnet. The magnetic sensor can be configured to include a compact integrated circuit package such as, for example, a small outline integrated circuit package (SOIC). A magnetic sensing element is generally mounted in the compact integrated circuit package.

The magnetic sensing device can be configured to incorporate a printed circuit board having a hole formed therein, such that the compact integrated circuit package is surface mounted off-center to the printed circuit board, so that the hole is located within the printed circuit board to match a shape of the magnet, thereby allowing the magnet to pass through the hole so as to be placed adjacent to the compact circuit package, completing the magnetic circuit. An orifice is built into the housing of the magnetic sensor permitting a tool to be passed through the orifice within the housing to contact the magnet for calibration optimization of the magnetic circuit thereof.

A magnetic sensing element can be mounted in an SOIC package, which in turn is surface mounted to a printed circuit board. Note that such a magnetic sensing element may simply be a magnet, such as, for example, magnet 126 illustrated in FIGS. 1 and 2, or may comprise one or more other magnetic sensing elements. In either case, the SOIC is mounted off center on the printed circuit board so that a hole can be placed within the printed circuit board that fits the shape of the magnet, which may or may not constitute the aforementioned magnetic sensing element, depending on the desires of the magnetic sensor designer and/or manufacturer. Such a magnet or magnetic sensing element can be configured as a small outline magnet, which passes through the hole in the printed circuit board adjacent to the SOIC to complete a magnetic circuit. The magnet is mounted such that the position of the magnet is adjustable to provide the optimum magnetic circuit. An orifice can be placed within the magnetic sensor to gain access to the magnet to push it into proper calibration position.

The magnetic sensor described herein thus also utilizes an injection port (e.g., orifice 123) for tool access for magnetic calibration. This eliminates the need to have a secondary, special port designed into the magnetic sensor that would require sealing by a second epoxy dispensing operation. The magnetic sensor utilizes an SOIC surface mounted package that mounts in the same plane of the printed circuit board. Conventional designs utilize an IC package that is mounted 90 degrees to the printed circuit board, thereby requiring a secondary solder attachment process. The magnetic sensor described and claimed herein permits the magnet to pass through the printed circuit board for calibration thereof. This new design thus permits the resulting magnetic sensor package to fit into increasingly smaller sensor profile applications.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A calibrated low profile magnetic sensor, wherein said magnetic sensor comprises:
    a magnetic sensing device formed within a housing, wherein said magnetic sensing device comprises at least one magnet, wherein said housing comprises an orifice wherein a tool is permitted to bass through said orifice within said housing to contact said at least one magnet to position said at least one magnet to an optimum calibrated position thereof, such that said at least one magnet is located coincident with an axis of said orifice;
    a compact integrated circuit package, wherein a magnetic sensing element is mounted to said compact integrated circuit package; and
    a printed circuit board having a hole formed therein, wherein said compact integrated circuit package is surface mounted off-center on said printed circuit board so that said hole is located within said printed circuit board to match a shape of said at least one magnet, thereby permitting said magnet to pass through said hole to complete a magnetic circuit thereof.

2. The magnetic sensor of claim 1 wherein said orifice is adapted for use with an epoxy injection dispensing process to encapsulate and seal said magnetic sensing device.

3. The magnetic sensor of claim 1 wherein said at least one magnet passes through said hole within said printed circuit board and adjacent to said compact integrated circuit package to complete a magnetic circuit thereof.

4. The magnetic sensor of claim 1 wherein said at least one magnet is mounted through said printed circuit board within said housing to provide an optimum magnetic circuit thereof.

5. The magnetic sensor of claim 1 further comprising comprises a plurality of ribs to provide a press fit for maintaining said at least one magnet in a calibrated position within said magnetic sensor.

6. The magnetic sensor of claim 1 wherein at least one groove is formed from said housing to receive a seal thereof.

7. The magnetic sensor of claim 6 wherein said seal comprises an O-ring seal positioned within said at least one groove.

8. The magnetic sensor of claim 1 wherein said compact integrated circuit package comprises a small outline integrated circuit package (SOIC).

9. The magnetic sensor of claim 1 wherein said at least one magnet comprises a small outline magnet.

10. The magnetic sensor of claim 1 wherein said orifice comprises an epoxy injection port used for an epoxy injection dispensing process and for tool access for a magnet position calibration.

11. The magnetic sensor of claim 1 further comprising a plastic cover, which surrounds and protects said printed circuit board, said at least one magnet and said compact integrated circuit package.

12. The magnetic sensor of claim 1 wherein said orifice comprises:
    a port for epoxy injection dispensing; and
    a hole for tool access for magnet position calibration.

13. The magnetic sensor of claim 1 further comprising a plurality of lead terminals.

14. The magnetic sensor of claim 1 wherein said tool comprises a calibration tool.

15. A calibrated, low-profile magnetic sensor, said magnetic sensor comprising:
    a magnetic sensing device formed within a housing, wherein said magnetic sensing device comprises at least one magnet;
    a compact integrated circuit package, wherein a magnetic sensing element is mounted to said compact integrated circuit package; and
    a printed circuit board having a hole formed therein, wherein said compact integrated circuit package is surface mounted off-center on said printed circuit board so that said hole is located within said printed circuit board to match a shape of said at least one magnet, thereby permitting said magnet to pass through said hole to complete the magnetic circuit thereof;
    wherein said housing comprises an orifice wherein a tool is permitted to pass through said orifice within said housing to contact said at least one magnet to position said at least one magnet to an optimum calibrated position thereof and wherein said orifice is adapted for use with an injection dispense epoxy to encapsulate and seal said magnetic sensing device.

16. A method for forming a magnetic sensor, said method comprising the steps of:

forming a magnetic sensing device within a housing, wherein said magnetic sensing device comprises at least one magnet;

configuring said housing to comprise an orifice wherein a tool is permitted to pass through said orifice within said housing to contact said at least one magnet to position said at least one magnet to an optimum calibrated position thereof;

adapting said orifice for use with an injection dispensing epoxy to encapsulate and seal said magnetic sensing device;

mounting a magnetic sensing element to a compact integrated circuit package; and forming a hole within a printed circuit board, wherein said compact integrated circuit package is surface mounted off-center on said printed circuit board so that said hole is located within said printed circuit board to match a shape of said at least one magnet, thereby permitting said magnet to pass through, said hole to complete a magnetic circuit thereof.

17. The method of claim 16 further comprising the step of:

passing said at least one magnet through said hole within said printed circuit board and adjacent to said compact integrated circuit package to complete a magnetic circuit thereof.

18. The method of claim 16 further comprising the step of:

mounting said at least one magnet through said printed circuit board within said housing to provide an optimum magnetic circuit thereof.

19. The method of claim 16 further comprising the step of:

configuring said magnetic sensor to comprise a plurality of ribs to provide a press fit for maintaining said at least one magnet in a calibrated position within said magnetic sensor.

20. The method of claim 16 further comprising the step of:

forming at least one groove from said housing to receive a seal thereof.

21. The method of claim 20 wherein said seal comprises an O-ring seal positioned within said at least one groove.

22. The method of claim 16 wherein said compact integrated circuit package comprises a small outline integrated circuit package (SOIC).

23. The method of claim 16 wherein said at least one magnet comprises a small outline magnet.

24. The method of claim 16 further comprising the step of:

configuring said orifice to comprise an epoxy injection port used for an epoxy injection dispensing process and for tool access for a magnet position calibration.

25. The method of claim 16 further comprising the step of:

locating at least one magnet coincident with an axis of said orifice.

26. The method of claim 16 further comprising the step of:

forming a plastic cover, which surrounds and protects said printed circuit board, said at least one magnet and said compact integrated circuit package.

27. The method of claim 16 further comprising the step of configuring said orifice to comprise:

a port for epoxy injection dispensing; and a hole for tool access for magnet position calibration.

28. The method of claim 16 further comprising the step of:

configuring said magnetic sensor to comprise a plurality of lead terminals.

29. The method of claim 16 wherein said tool comprises a calibration tool.

30. A method for forming a calibrated, low profile magnetic sensor, said method comprising the steps of:

forming a magnetic sensing device within a housing, wherein said magnetic sensing device comprises at least one magnet;

mounting said magnetic sensing device to a compact integrated circuit package; and forming a hole within a printed circuit board, wherein said compact integrated circuit package is surface mounted off-center on said printed circuit board so that said hole is located within said printed circuit board to match a shape of said at least one magnet, thereby permitting said magnet to pass through said hole to complete the magnetic circuit thereof;

configuring said housing to comprise an orifice wherein a tool is permitted to pass through said orifice within said housing to contact said at least one magnet to position said at least one magnet to an optimum calibrated position thereof; and adapting said orifice for use with an injection dispense epoxy to encapsulate and seal said magnetic sensing device.

* * * * *

UNITED STATES PATENT AND TRADEMARK OFFICE
CERTIFICATE OF CORRECTION

PATENT NO.    : 6,798,193 B2
DATED         : September 28, 2004
INVENTOR(S)   : Zimmerman et al.

It is certified that error appears in the above-identified patent and that said Letters Patent is hereby corrected as shown below:

<u>Column 7,</u>
Line 54, delete the word "bass" and replace with the word -- pass --

Signed and Sealed this

Fifth Day of April, 2005

JON W. DUDAS
*Director of the United States Patent and Trademark Office*